United States Patent
Song

(10) Patent No.: US 10,937,837 B2
(45) Date of Patent: Mar. 2, 2021

(54) DISPLAY CONTROL METHOD AND APPARATUS, AND DISPLAY APPARATUS FOR DETERMINING TARGET LUMINANCE DATA

(71) Applicant: BOE TECHNOLOGY GROUP CO., LTD., Beijing (CN)

(72) Inventor: Danna Song, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 307 days.

(21) Appl. No.: 16/062,827

(22) PCT Filed: Jan. 25, 2018

(86) PCT No.: PCT/CN2018/074162
§ 371 (c)(1),
(2) Date: Jun. 15, 2018

(87) PCT Pub. No.: WO2019/000931
PCT Pub. Date: Jan. 3, 2019

(65) Prior Publication Data
US 2020/0273913 A1 Aug. 27, 2020

(30) Foreign Application Priority Data
Jun. 30, 2017 (CN) .......................... 201710519926.5

(51) Int. Cl.
*H01L 27/32* (2006.01)
*G09G 3/3225* (2016.01)

(52) U.S. Cl.
CPC .......... *H01L 27/322* (2013.01); *G09G 3/3225* (2013.01); *H01L 27/3213* (2013.01); *G09G 2320/0233* (2013.01)

(58) Field of Classification Search
CPC . H01L 27/322; H01L 27/3213; G09G 3/3225; G09G 2320/0233
See application file for complete search history.

(56) References Cited

U.S. PATENT DOCUMENTS 6,181,445 B1 1/2001 Lin et al.
2008/0252653 A1* 10/2008 Alessi .................. G09G 3/3208
345/589
(Continued)

FOREIGN PATENT DOCUMENTS

CN 101369416 A 2/2009
CN 101866642 A 10/2010
(Continued)

OTHER PUBLICATIONS

International Search Report of PCT/CN2018/074162 in Chinese, dated Apr. 3, 2018 with English translation.
(Continued)

Primary Examiner — Wing H Chow
(74) Attorney, Agent, or Firm — Collard & Roe, P.C.

(57) ABSTRACT

A display control method and apparatus, and a display apparatus. The method includes: acquiring an actual chromaticity coordinate of light of a mixed color sub pixel; calculating respective proportions of light of primary-color sub-pixels within the light of the mixed-color sub-pixel, according to the actual chromaticity coordinate of the light of the mixed-color sub-pixel and chromaticity coordinates of the light of the primary-color sub-pixels; and determining target luminance data of the mixed-color sub-pixel and target luminance data of the primary-color sub-pixels, according to initial luminance data of the primary-color sub-pixels and the respective proportions of the light of the primary-color sub-pixels within the light of the mixed-color sub-pixel.

13 Claims, 4 Drawing Sheets

(56) References Cited

U.S. PATENT DOCUMENTS

2013/0020933 A1\* 1/2013 Levermore ......... H01L 27/3213
　　　　　　　　　　　　　　　　　　　　　　　　313/504
2016/0307493 A1 10/2016 Song et al.

FOREIGN PATENT DOCUMENTS

CN　　　107134260 A　　9/2017
WO　　2016/062248 A1　　4/2016

OTHER PUBLICATIONS

Notice of Transmittal of the International Search Report of PCT/CN2018/074162 in Chinese, dated Apr. 3, 2018.
Written Opinion of the International Searching Authority of PCT/CN2018/074162 in Chinese, dated Apr. 3, 2018 with English translation.

\* cited by examiner

DISPLAY CONTROL METHOD AND APPARATUS, AND DISPLAY APPARATUS FOR DETERMINING TARGET LUMINANCE DATA

CROSS REFERENCE TO RELATED APPLICATIONS

This application is the National Stage of PCT/CN2018/074162 filed on Jan. 25, 2018, which claims priority under 35 U.S.C. § 119 of Chinese Application No. 201710519926.5 filed on Jun. 30, 2017, the disclosure of which is incorporated by reference.

TECHNICAL FIELD

Embodiments of the present disclosure relate to a display control method and apparatus, and a display apparatus.

BACKGROUND

An Active Matrix Organic Light Emitting Diode (AMO-LED) display apparatus, as a next-generation display apparatus, attracts a lot of attention due to its characteristics such as a fast response speed, a high luminous efficiency, high brightness, and a wide viewing angle. An organic light emitting diode display apparatus displays an image by controlling a current flowing through an organic light emitting diode by a driving transistor.

With reference to FIG. 1, a structural schematic diagram of a conventional white Organic Light Emitting Diode (OLED) display apparatus is shown. A white Organic Light Emitting Diode (OLED) display apparatus may implement full color display through white OLED (WOLED) devices plus color filters of three colors of RGB. The white OLED display apparatus has a plurality of pixels, each pixel includes a red sub-pixel for generating red light, a green sub-pixel for generating green light, a blue sub-pixel for generating blue light, and a white sub-pixel for generating white light, and each sub-pixel includes a white OLED device. For example, the red sub-pixel further includes a R color filter (RCF) for transmitting red light included in white light that is incident from the white OLED device; the green sub-pixel further includes a G color filter (GCF) for transmitting green light included in white light that is incident from the white OLED device; the blue sub-pixel further includes a B color filter (BCF) for transmitting blue light included in white light that is incident from the white OLED device; the white sub-pixel has no color filter (CF), and transmits all white light that is incident from the white OLED device. A white OLED device has a structure including a red (R) light emitting layer, a green (G) light emitting layer and a blue (B) light emitting layer which are stacked between a cathode and an anode, or a structure including a yellow (Y) light emitting layer and a blue (B) light emitting layer that are stacked between the cathode and the anode.

The inventor notices that: in a conventional white OLED display apparatus having primary-color sub-pixels and a mixed-color sub-pixel, white color is displayed by a combination of light emitting layers of various colors; and when the white OLED device is aged, a chromaticity coordinate of light of the white sub-pixel may shift, causing color cast of a display color.

SUMMARY

Embodiments of the disclosure provide a display control method, applied to a display apparatus having primary-color sub-pixels and a mixed-color sub-pixel, comprising:

acquiring an actual chromaticity coordinate of light of a current mixed-color sub-pixel, wherein the primary-color sub-pixels include sub-pixels of at least two colors, and the mixed-color sub-pixel includes a sub-pixel of one color, and light of the primary-color sub-pixels is mixed to obtain the light of the mixed-color sub-pixel;

calculating respective proportions of the light of the primary-color sub-pixels within the light of the mixed-color sub-pixel, according to the actual chromaticity coordinate of the light of the mixed-color sub-pixel and chromaticity coordinates of the light of the primary-color sub-pixels; and determining target luminance data of the mixed-color sub-pixel and target luminance data of the primary-color sub-pixels, according to initial luminance data of the primary-color sub-pixels and the respective proportions of the light of the primary-color sub-pixels within the light of the mixed-color sub-pixel.

For example, the primary-color sub-pixels include a red sub-pixel, a green sub-pixel and a blue sub-pixel, and the mixed-color sub-pixel is a white sub-pixel; or, the primary-color sub-pixels include a yellow sub-pixel and a blue sub-pixel, and the mixed-color sub-pixel is a white sub-pixel.

For example, the display apparatus is an OLED display apparatus, and each of the red sub-pixel, the green sub-pixel, the blue sub-pixel and the white sub-pixel includes a white OLED device; and the red sub-pixel, the green sub-pixel and the blue sub-pixel obtain colors of their own through color filters respectively. The step of acquiring the actual chromaticity coordinate of the light of the current mixed-color sub-pixel, includes:

pre-measuring actual chromaticity coordinates of light emitted by a white OLED device under different lifetime indices, and storing the actual chromaticity coordinates in a storage unit; and based on a lifetime index of a white OLED device corresponding to a current white sub-pixel, searching in the storage unit for an actual chromaticity coordinate of light emitted by the white OLED device that corresponds to the lifetime index, which is treated as the actual chromaticity coordinate of the light of the current white sub-pixel.

For example, the step of acquiring the actual chromaticity coordinate of the light of the current mixed-color sub-pixel, includes:

measuring the actual chromaticity coordinate of the light of the white sub-pixel, under a current lifetime index of a white OLED device corresponding to the current white sub-pixel.

For example, after the step of determining the target luminance data of the mixed-color sub-pixel and the target luminance data of the primary-color sub-pixels, according to the initial luminance data of the primary-color sub-pixels and the respective proportions of the light of the primary-color sub-pixels within the light of the mixed-color sub-pixel, the method further comprises:

determining compensation ratios of the white sub-pixel and the primary-color sub-pixels, according to lifetime indices of white OLED devices corresponding to the white sub-pixel and the primary-color sub-pixels; and compensating the white OLED devices and driving transistors corresponding to the white sub-pixel and the primary-color sub-pixels, according to the target luminance data and the compensation ratios.

For example, before the step of calculating the respective proportions of the light of the primary-color sub-pixels within the light of the mixed-color sub-pixel, according to the actual chromaticity coordinate of the light of the mixed-color sub-pixel and the chromaticity coordinates of the light of the primary-color sub-pixels, the method further comprises:

measuring the actual chromaticity coordinates of the light of the primary-color sub-pixels, under current lifetime indices of white OLED devices corresponding to the current primary-color sub-pixels.

For example, the step of determining the target luminance data of the mixed-color sub-pixel and the target luminance data of the primary-color sub-pixels, according to the initial luminance data of the primary-color sub-pixels and the respective proportions of the light of the primary-color sub-pixels within the light of the mixed-color sub-pixel, includes:

calculating first luminance data by dividing initial luminance data of the red sub-pixel by a proportion of light of the red sub-pixel within the light of the white sub-pixel; calculating second luminance data by dividing initial luminance data of the green sub-pixel by a proportion of light of the green sub-pixel within the light of the white sub-pixel; and calculating third luminance data by dividing initial luminance data of the blue sub-pixel by a proportion of light of the blue sub-pixel within the light of the white sub-pixel;

taking minimum luminance data among the first luminance data, the second luminance data and the third luminance data as target luminance data of the white sub-pixel, and taking a sub-pixel corresponding to the minimum luminance data as a target sub-pixel, sub-pixels within the primary-color sub-pixels except the target sub-pixel being other sub-pixels; and for each of the other sub-pixels, calculating a product of the target luminance data of the white sub-pixel and a proportion of light of the other sub-pixel within the light of the white sub-pixel, and deducting the product from initial luminance data of the other sub-pixel, a resulting difference being target luminance data of the other sub-pixel.

Embodiments of the disclosure further provide a display control apparatus, comprising:

a chromaticity coordinate acquiring module, configured to acquire an actual chromaticity coordinate of light of a current mixed-color sub-pixel;

a proportion calculating module, configured to calculate respective proportions of light of primary-color sub-pixels within the light of the mixed-color sub-pixel, according to the actual chromaticity coordinate of the light of the mixed-color sub-pixel and chromaticity coordinates of the light of the primary-color sub-pixels; and a target luminance data determining module, configured to determine target luminance data of the mixed-color sub-pixel and target luminance data of the primary-color sub-pixels, according to initial luminance data of the primary-color sub-pixels and the respective proportions of the light of the primary-color sub-pixels within the light of the mixed-color sub-pixel.

For example, the primary-color sub-pixels include a red sub-pixel, a green sub-pixel and a blue sub-pixel, and the mixed-color sub-pixel is a white sub-pixel; or the primary-color sub-pixels include a yellow sub-pixel and a blue sub-pixel, and the mixed-color sub-pixel is a white sub-pixel.

For example, the chromaticity coordinate acquiring module includes:

a first chromaticity coordinate measuring sub-module, configured to pre-measure actual chromaticity coordinates of light emitted by a white OLED device under different lifetime indices, and store the actual chromaticity coordinates in a storage unit; and a chromaticity coordinate searching sub-module, configured to: based on a lifetime index of a white OLED device corresponding to a current white sub-pixel, search in the storage unit for an actual chromaticity coordinate of light emitted by the white OLED device that corresponds to the lifetime index, which is treated as the actual chromaticity coordinate of the light of the current white sub-pixel.

For example, the chromaticity coordinate acquiring module includes:

a second chromaticity coordinate measuring sub-module, configured to measure the actual chromaticity coordinate of the light of the white sub-pixel, under a current lifetime index of a white OLED device corresponding to the current white sub-pixel.

For example, the apparatus further comprises:

a proportion determining module, configured to determine compensation ratios of the white sub-pixel and the primary-color sub-pixels, according to lifetime indices of white OLED devices corresponding to the white sub-pixel and the primary-color sub-pixels;

a compensating module, configured to compensate the white OLED devices and driving transistors corresponding to the white sub-pixel and the primary-color sub-pixels, according to the target luminance data and the compensation ratios.

For example, the apparatus further comprises:

a chromaticity coordinate measuring module, configured to measure actual chromaticity coordinates of the light of the primary-color sub-pixels, under current lifetime indices of white OLED devices corresponding to the current primary-color sub-pixels.

For example, the target luminance data determining module includes:

a luminance data calculating sub-module, configured to: calculate first luminance data by dividing initial luminance data of the red sub-pixel by a proportion of light of the red sub-pixel within the light of the white sub-pixel; calculate second luminance data by dividing initial luminance data of the green sub-pixel by a proportion of light of the green sub-pixel within the light of the white sub-pixel; and calculate third luminance data by dividing initial luminance data of the blue sub-pixel by a proportion of light of the blue sub-pixel within the light of the white sub-pixel;

a target luminance data determining sub-module, configured to: take minimum luminance data among the first luminance data, the second luminance data and the third luminance data as target luminance data of the white sub-pixel; and take a sub-pixel corresponding to the minimum luminance data as a target sub-pixel, sub-pixels within the primary-color sub-pixels except the target sub-pixel being other sub-pixels; and a target luminance data calculating sub-module, configured to: for each of the other sub-pixels, calculate a product of the target luminance data of the white sub-pixel and a proportion of light of the other sub-pixel within the light of the white sub-pixel, and deduct the product from initial luminance data of the other sub-pixel, a resulting difference being target luminance data of the other sub-pixel.

Embodiments of the disclosure further provide a display apparatus, comprising the apparatus described above.

BRIEF DESCRIPTION OF THE DRAWINGS

In order to illustrate the technical solutions in the embodiments of the present disclosure or the existing arts more clearly, the drawings needed to be used in the description of the embodiments or the existing arts will be briefly described in the following; it is obvious that the drawings described below are only related to some embodiments of the present disclosure, for one ordinary skilled person in the art, other drawings can be obtained according to these drawings without making other inventive work.

DETAILED DESCRIPTION

Hereafter, the technical solutions of the embodiments of the present disclosure will be described in a clearly and fully understandable way in connection with the drawings related to the embodiments of the disclosure. It is obvious that the described embodiments are just a part but not all of the embodiments of the present disclosure. Based on embodiments of the present disclosure, all other embodiments obtained by those skilled in the art without making other inventive work should be within the scope of the present disclosure.

Embodiments of the present disclosure provide a display control method and apparatus, and a display apparatus, which can solve the problem of non-uniformity of a display color caused by shift of chromaticity coordinates of a white sub-pixel when a white OLED device is aged.

The embodiments of the present disclosure are applied to a display apparatus having primary-color sub-pixels and a mixed-color sub-pixel, wherein the primary-color sub-pixels include sub-pixels of at least two colors, and the mixed-color sub-pixel includes a sub-pixel of one color. Light of the primary-color sub-pixels may be mixed to obtain the light of the mixed-color sub-pixel.

Embodiment One

Figure 1:
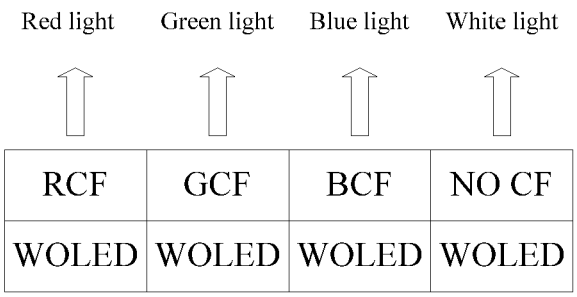
FIG. 1 shows a structural schematic diagram of a conventional white OLED display apparatus.
Figure 2:
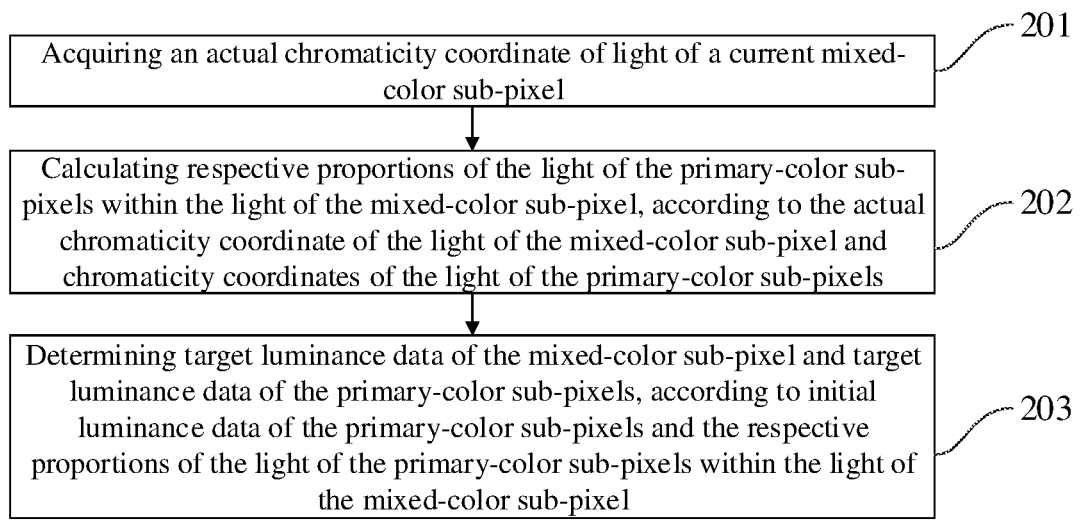
FIG. 2 shows a flow chart of a display control method according to a first embodiment of the present disclosure.

With reference to FIG. 2, a flow chart of a display control method according to Embodiment One of the present disclosure is shown, which may specifically comprise steps including:

Step 201: acquiring an actual chromaticity coordinate of light of a current mixed-color sub-pixel.

In an embodiment of the present disclosure, the mixed-color sub-pixel is a white sub-pixel; when a white OLED device is aged, a chromaticity coordinate of light of the white sub-pixel may shift, such that the light of the white sub-pixel contains certain proportions of the light of primary-color sub-pixels.

For example, the primary-color sub-pixels include a red sub-pixel, a green sub-pixel and a blue sub-pixel, and the mixed-color sub-pixel is a white sub-pixel; or the primary-color sub-pixels include a yellow sub-pixel and a blue sub-pixel, and the mixed-color sub-pixel is a white sub-pixel. White light may be obtained by mixing red light emitted by the red sub-pixel, green light emitted by the green sub-pixel, and blue light emitted by the blue sub-pixel; and white light may also be obtained by mixing yellow light emitted by the yellow sub-pixel and blue light emitted by the blue sub-pixel; and when the white OLED device corresponding to the white sub-pixel is not aged, light emitted by the white sub-pixel is white light.

Subsequent description will be provided by taking a case where the primary-color sub-pixels include the red sub-pixel, the green sub-pixel and the blue sub-pixel, and the mixed-color sub-pixel is the white sub-pixel as an example.

When the white OLED display apparatus are about to display, the white OLED devices corresponding to the white sub-pixel and the primary-color sub-pixels emit light, and light emitted by all the white OLED devices is white light; the red sub-pixel includes a R color filter, which may convert white light emitted by a white OLED device into red light; the green sub-pixel includes a G color filter, which may convert white light emitted by a white OLED device into green light; and the blue sub-pixel includes a B color filter, which may convert white light emitted by a white OLED device into blue light.

It should be noted that, the display apparatus is an OLED display apparatus, and each of the red sub-pixel, the green sub-pixel, the blue sub-pixel and the white sub-pixel includes a white OLED device; and the red sub-pixel, the green sub-pixel and the blue sub-pixel respectively obtain colors of their own through the color filters. With elongation of service time, the white OLED devices of the respective sub-pixels may undergo a certain degree of aging. Since the red sub-pixel, the green sub-pixel and the blue sub-pixel respectively have the R color filter, the G color filter and the B color filter corresponding thereto, and the white sub-pixel has no color filter, a shift degree of the chromaticity coordinate of the light of the white sub-pixel is relatively large with respect to those of the red sub-pixel, the green sub-pixel and the blue sub-pixel. Therefore, in an embodiment of the present disclosure, only color cast of a display color caused by the shift of the chromaticity coordinate of the light of the white sub-pixel is taken into consideration.

Generally, the chromaticity coordinate of the light of the white sub-pixel may be obtained in at least two modes below.

First mode: pre-measuring actual chromaticity coordinates of light emitted by the white OLED device under different lifetime indices, and storing the actual chromaticity coordinates in a storage unit; and based on a lifetime index of a white OLED device corresponding to a current white sub-pixel, searching in the storage unit for an actual chromaticity coordinate of light emitted by the white OLED device that corresponds to the lifetime index, which is treated as an actual chromaticity coordinate of the light of the current white sub-pixel.

Under normal circumstances, with respect to the white sub-pixel, its driving transistor and white OLED device are aged under a completely same condition during use, and there is a mapping relationship between a threshold voltage of the driving transistor and the lifetime index of the white OLED device. Through experimental tests, lifetime indices of the white OLED device corresponding to different threshold voltages of the driving transistor are determined; and under different lifetime indices of the white OLED device, the actual chromaticity coordinates of light emitted by the white OLED device are actually measured, and stored in the storage unit. A lifetime index of the white OLED device is determined according to a current threshold voltage of the driving transistor corresponding to the white sub-pixel, and an actual chromaticity coordinate of light emitted by the white OLED device corresponding to the lifetime index is searched in the storage unit, which is treated as an actual chromaticity coordinate of the light of the current white sub-pixel.

Second mode: measuring an actual chromaticity coordinates of the light of the current white sub-pixel, under a current lifetime index of the white OLED device corresponding to the current white sub-pixel.

Under the lifetime index of the white OLED device corresponding to the current white sub-pixel, the actual chromaticity coordinate of light emitted by the white OLED device is actually measured, which is treated as an actual chromaticity coordinate of the light of the white sub-pixel.

It should be noted that, the first mode and the second mode are different in times of measurement and use. The first mode is pre-measuring the actual chromaticity coordinates of light emitted by the white OLED device under different lifetime indices, and storing them in the storage unit, and when a picture is about to be displayed, searching the actual chromaticity coordinate of light emitted by the white OLED device from the storage unit; and the second mode is directly measuring the actual chromaticity coordinate of light emitted by the current white OLED device, when the picture is about to be displayed.

Step 202: calculating respective proportions of the light of the primary-color sub-pixels within the light of the mixed-color sub-pixel, according to the actual chromaticity coordinate of the light of the mixed-color sub-pixel and chromaticity coordinates of the light of the primary-color sub-pixels.

In an embodiment of the present disclosure, the respective proportions of the light of the corresponding primary-color sub-pixels within the light of the white sub-pixel are calculated, according to the actual chromaticity coordinate of the light of the white sub-pixel and the chromaticity coordinates of the light of the primary-color sub-pixels obtained. For example, when the primary-color sub-pixels include the red sub-pixel, the green sub-pixel and the blue sub-pixel, a proportion of the light of the red sub-pixel within the light of the white sub-pixel, a proportion of the light of the green sub-pixel within the light of the white sub-pixel and a proportion of the light of the blue sub-pixel within the light of the white sub-pixel are calculated.

It should be noted that, the respective proportions of the light of the corresponding primary-color sub-pixels within the light of the white sub-pixel refer to percentages of the light of respective primary-color sub-pixels within the light of the white sub-pixel, which represent ratio coefficients. For example, a proportion of the light of the corresponding red sub-pixel within the light of the white sub-pixel is 20%, a proportion of the light of the corresponding green sub-pixel within the light of the white sub-pixel is 40%, and a proportion of the light of the corresponding blue sub-pixel within the light of the white sub-pixel is 40%.

For example, the actual chromaticity coordinates of the light of the current primary-color sub-pixels may be individually measured. Since only the shift of the chromaticity coordinate of the light of the white sub-pixel is taken into consideration in embodiments of the present disclosure, the chromaticity coordinates of the light of the primary-color sub-pixels may also be directly determined according to a chromaticity coordinate diagram. The actual chromaticity coordinates of the light of the current primary-color sub-pixels obtained by measuring are more accurate.

Step 203: determining target luminance data of the mixed-color sub-pixel and target luminance data of the primary-color sub-pixels, according to initial luminance data of the primary-color sub-pixels and the respective proportions of the light of the primary-color sub-pixels within the light of the mixed-color sub-pixel. For example, description of FIG. 3 below may be referred to for detailed description of step 203.

In an embodiment of the present disclosure, target luminance data of the white sub-pixel and target luminance data of the primary-color sub-pixels are determined according to initial luminance data of the primary-color sub-pixels in an image to be displayed and the respective proportions of the light of the primary-color sub-pixels within the light of the white sub-pixel.

The initial luminance data of the primary-color sub-pixels in the image to be displayed is readjusted to the target luminance data of the white sub-pixel and the primary-color sub-pixels, so that a final display color of the image to be displayed has no color cast. The target luminance data is final display luminance data of the image to be displayed, and the initial luminance data is luminance data input by the image to be displayed.

For example, display data of the image to be displayed may be acquired from a signal source, and the display data includes gray-scale data of the primary-color sub-pixels. Usually, the gray-scale data of the primary-color sub-pixels is converted into the initial luminance data using a gamma curve, and the gamma curve is used for representing display luminance of sub-pixels of respective colors under different gray scales; currently, a gamma curve 2.2 is used most commonly, that is, the initial luminance data of the primary-color sub-pixels is 2.2th power of the gray-scale data.

Alternatively, in the display data of the image to be displayed obtained from the signal source, the display data may also be driving voltages of the primary-color sub-pixels, and corresponding gray-scale data may be set by controlling sizes of the driving voltages.

In an embodiment of the present disclosure, the actual chromaticity coordinate of the light of the current mixed-color sub-pixel is acquired; the respective proportions of the light of the primary-color sub-pixels within the light of the mixed-color sub-pixel are calculated, according to the actual chromaticity coordinate of the light of the mixed-color sub-pixel and the chromaticity coordinates of the light of the primary-color sub-pixels; and the target luminance data of the mixed-color sub-pixel and the target luminance data of the primary-color sub-pixels are determined, according to the initial luminance data of the primary-color sub-pixels and the respective proportions of the light of the primary-color sub-pixels within the light of the mixed-color sub-pixel. The mixed-color sub-pixel is generally the white sub-pixel. When the white OLED device is aged, the chromaticity coordinate of the light of the white sub-pixel may shift. The target luminance data of the white sub-pixel and the target luminance data of the primary-color sub-pixels are determined according to the proportions of the light of the primary-color sub-pixels included within the light of the white sub-pixel and the initial luminance data of the primary-color sub-pixels, so that the final display color of the image has no color cast.

Embodiment Two

Figure 3:
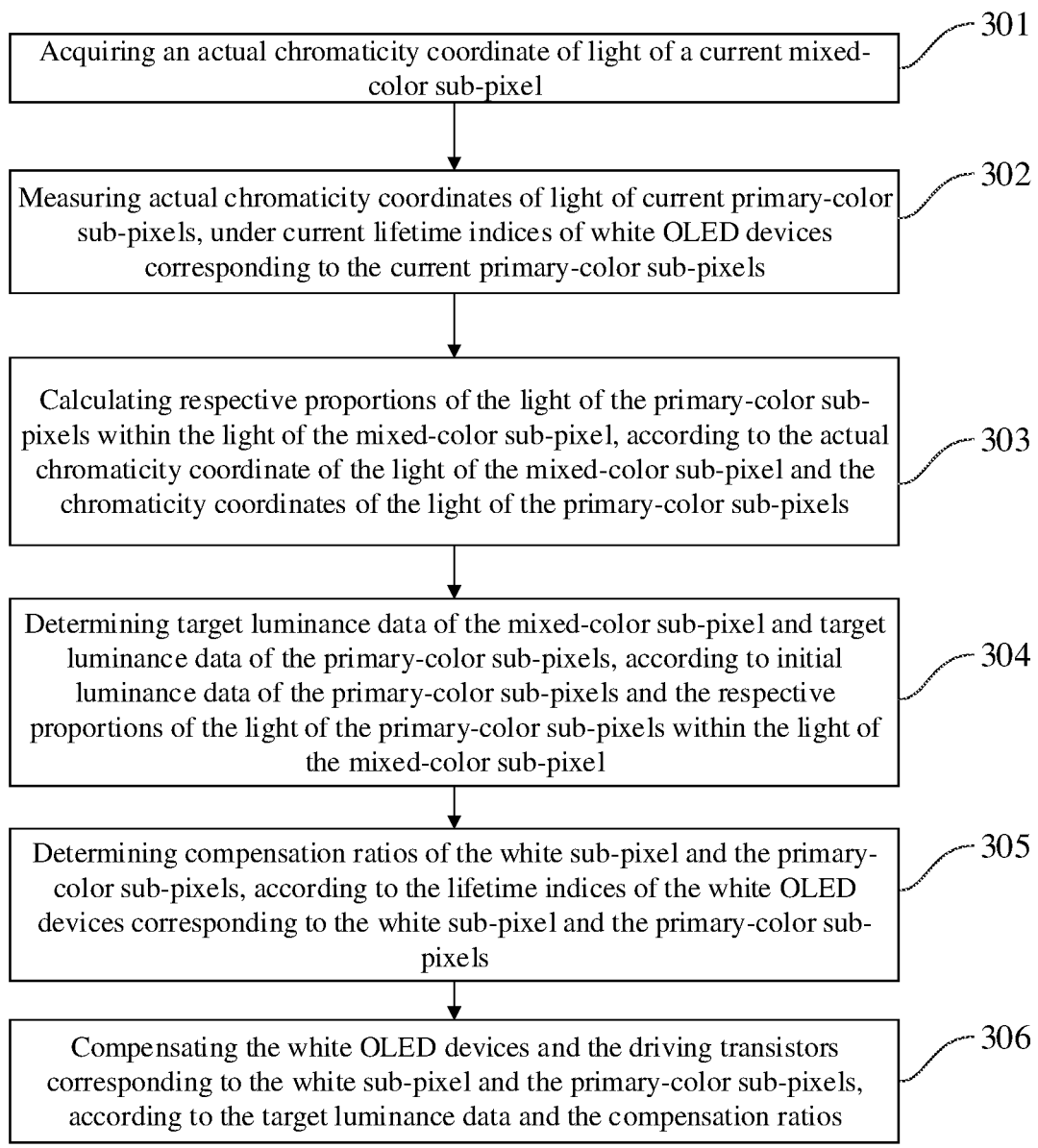
FIG. 3 shows a flow chart of a display control method according to a second embodiment of the present disclosure.

With reference to FIG. 3, a flow chart of a display control method according to Embodiment Two of the present disclosure is shown, which may specifically comprise steps including:

Step 301: acquiring an actual chromaticity coordinate of light of a current mixed-color sub-pixel.

This step has a principle similar to that of step 201 according to Embodiment One, which will not be repeated here.

Step 302: measuring actual chromaticity coordinates of light of current primary-color sub-pixels, under current lifetime indices of white OLED devices corresponding to the current primary-color sub-pixels.

In an embodiment of the present disclosure, the primary-color sub-pixels include a red sub-pixel, a green sub-pixel and a blue sub-pixel. The step of measuring actual chromaticity coordinates of light of current primary-color sub-pixels, under current lifetime indices of white OLED devices corresponding to the current primary-color sub-pixels, includes: measuring an actual chromaticity coordinate of the light of the red sub-pixel, measuring an actual chromaticity coordinate of the light of the green sub-pixel, and measuring an actual chromaticity coordinate of the light of the blue sub-pixel.

Step 303: calculating respective proportions of the light of the primary-color sub-pixels within the light of the mixed-color sub-pixel, according to the actual chromaticity coordinate of the light of the mixed-color sub-pixel and the chromaticity coordinates of the light of the primary-color sub-pixels.

This step has a principle similar to that of step 202 according to Embodiment One, which will not be repeated here.

Step 304: determining target luminance data of the mixed-color sub-pixel and target luminance data of the primary-color sub-pixels, according to initial luminance data of the primary-color sub-pixels and the respective proportions of the light of the primary-color sub-pixels within the light of the mixed-color sub-pixel.

In an embodiment of the present disclosure, target luminance data of the white sub-pixel and target luminance data of the primary-color sub-pixels are re-determined, according to the initial luminance data of the primary-color sub-pixels and the respective proportions of the light of the primary-color sub-pixels within the light of the white sub-pixel, so that a final display color of an image to be displayed has no color cast.

Specifically, first luminance data is calculated, by dividing initial luminance data of the red sub-pixel with a proportion of the light of the red sub-pixel within the light of the white sub-pixel; second luminance data is calculated, by dividing initial luminance data of the green sub-pixel with a proportion of the light of the green sub-pixel within the light of the white sub-pixel; third luminance data is calculated, by dividing initial luminance data of the blue sub-pixel with a proportion of the light of the blue sub-pixel within the light of the white sub-pixel; minimum luminance data among the first luminance data, the second luminance data and the third luminance data is taken as the target luminance data of the white sub-pixel, and a sub-pixel corresponding to the minimum luminance data is taken as a target sub-pixel; with respect to each of the other sub-pixels (except the target sub-pixel, remaining sub-pixels within the primary-color sub-pixels are simply referred to as the other sub-pixels), a product of the target luminance data of the white sub-pixel and the proportion of the light of the other sub-pixel within the light of the white sub-pixel is firstly calculated, then the product is deducted from the initial luminance data of the other sub-pixel, and the resulting difference is target luminance data of the other sub-pixel.

For example, the initial luminance data of the red sub-pixel is Ri, the initial luminance data of the green sub-pixel is Gi, the initial luminance data of the blue sub-pixel is Bi, the proportion of the light of the red sub-pixel within the light of the white sub-pixel is Rs, the proportion of the light of the green sub-pixel within the light of the white sub-pixel is Gs, the proportion of the light of the blue sub-pixel within the light of the white sub-pixel is Bs; first luminance data Ls1 is calculated, by dividing the initial luminance data Ri of the red sub-pixel by the proportion Rs of the light of the red sub-pixel within the light of the white sub-pixel; second luminance data Ls2 is calculated, by dividing the initial luminance data Gi of the green sub-pixel by the proportion Gs of the light of the green sub-pixel within the light of the white sub-pixel; and third luminance data Ls3 is calculated, by dividing the initial luminance data Bi of the blue sub-pixel by the proportion Bs of the light of the blue sub-pixel within the light of the white sub-pixel; where Ls1=Ri/Rs, Ls2=Gi/Gs, and Ls3=Bi/Bs.

Sizes of the first luminance data Ls1, the second luminance data Ls2 and the third luminance data Ls3 are determined, the minimum luminance data among Ls1, Ls2 and Ls3 is taken as the target luminance data of the white sub-pixel, and a sub-pixel corresponding to the minimum luminance data is taken as the target sub-pixel. For example, when the first luminance data Ls1 is the minimum among Ls1, Ls2 and Ls3, Ls1 is taken as the target luminance data of the white sub-pixel, the red sub-pixel is taken as the target sub-pixel, and the white sub-pixel emits light in place of the red sub-pixel; when the second luminance data Ls2 is the minimum among Ls1, Ls2 and Ls3, Ls2 is taken as the target luminance data of the white sub-pixel, the green sub-pixel is taken as the target sub-pixel, and the white sub-pixel emits light in place of the green sub-pixel; and when the third luminance data Ls3 is the minimum among Ls1, Ls2 and Ls3, Ls3 is taken as the target luminance data of the white sub-pixel, the blue sub-pixel is taken as the target sub-pixel, and the white sub-pixel emits light in place of the blue sub-pixel. In addition, when any two pieces of luminance data among the first luminance data Ls1, the second luminance data Ls2 and the third luminance data Ls3 are equal to each other, and are smaller than the remaining piece of the luminance data, the white sub-pixel emits light in place of the sub-pixels corresponding to the any two pieces of luminance data. For example, when Ls1 and Ls2 are equal to each other, and are smaller than Ls3, the white sub-pixel emits light in place of the red sub-pixel and the green sub-pixel.

For example, a purpose of selecting the target sub-pixel among the primary-color sub-pixels is to let the white sub-pixel emit light in place of the target sub-pixel. Because the white sub-pixel has no color filter, transmittance of the white sub-pixel is greater than transmittance of the red sub-pixel, transmittance of the green sub-pixel and transmittance of the blue sub-pixel. A combination of red light emitted by the red sub-pixel, green light emitted by the green sub-pixel and blue light emitted by the blue sub-pixel may produce white light. Therefore, the white sub-pixel may be used for emitting light in place of the target sub-pixel, which may not only reduce power consumption caused by low transmittance, but also achieve a same display effect.

For example, when the first luminance data Ls1 is the minimum, and the target luminance data of the white sub-pixel is Ls1, the target luminance data of the green sub-pixel is Gi-Ls1×Gs, the target luminance data of the blue sub-pixel is Bi-Ls1×Bs, and the target luminance data of the red sub-pixel is 0 (for example, the white sub-pixel emits light in place of the red sub-pixel, with the target luminance data being Ls1, and the red sub-pixel does not emit light); when the second luminance data Ls2 is the minimum, and the target luminance data of the white sub-pixel is Ls2, the target luminance data of the red sub-pixel is Ri-Ls2×Rs, the target luminance data of the blue sub-pixel is Bi-Ls2×Bs, and the target luminance data of the green sub-pixel is 0 (for example, the white sub-pixel emits light in place of the green sub-pixel, with the target luminance data being Ls2, and the green sub-pixel does not emit light); when the third luminance data Ls3 is the minimum, the target luminance data of the white sub-pixel is Ls3, the target luminance data of the red sub-pixel is Ri-Ls3×Rs, the target luminance data of the green sub-pixel is Gi-Ls3×Gs, and the target luminance data of the blue sub-pixel is 0 (for example, the white sub-pixel emits light in place of the blue sub-pixel, with the target luminance data being Ls3, and the blue sub-pixel does not emit light).

Step 305: determining compensation ratios of the white sub-pixel and the primary-color sub-pixels, according to the lifetime indices of the white OLED devices corresponding to the white sub-pixel and the primary-color sub-pixels.

In an embodiment of the present disclosure, with respect to each sub-pixel, when the white OLED device is aged, there is a mapping relationship between a threshold voltage of a driving transistor and the lifetime index of the white OLED device. Through experimental tests, lifetime indices of the white OLED device corresponding to different threshold voltages of the driving transistor are determined, wherein a lifetime index refers to an attenuation ratio of luminous efficiency. When the white OLED devices corresponding to the white sub-pixel and the primary-color sub-pixels are under different lifetime indices, the attenuation ratio of the luminous efficiency corresponding to the white sub-pixel and the attenuation ratios of the luminous efficiency corresponding to the primary-color sub-pixels may be determined; and the compensation ratio of the white sub-pixel and the compensation ratios of the primary-color sub-pixels are determined according to the attenuation ratios of the luminous efficiency. Under normal circumstances, the greater the attenuation ratio of the luminous efficiency is, the greater the electrical compensation ratio is needed.

The lifetime indices of the white OLED devices are determined according to threshold voltages of the driving transistors corresponding to the current white sub-pixel and primary-color sub-pixels; and then the compensation ratios of the white sub-pixel and the primary-color sub-pixels are determined according to the lifetime indices of the white OLED devices corresponding to the current white sub-pixel and primary-color sub-pixels.

Step 306: compensating the white OLED devices and the driving transistors corresponding to the white sub-pixel and the primary-color sub-pixels, according to the target luminance data and the compensation ratios.

In an embodiment of the present disclosure, according to the target luminance data of the white sub-pixel and the primary-color sub-pixels, as well as the compensation ratios of the white sub-pixel and the primary-color sub-pixels, the luminous efficiency of their respective white OLED devices is compensated, and the threshold voltages and mobility ratios of the driving transistors are compensated, to implement final display of an image by adjusting the driving voltages.

For example, the attenuation ratio of the luminous efficiency of the white OLED device corresponding to the white sub-pixel is 80%, and the target luminance data of the white sub-pixel is A, then a luminance value after the white OLED device is compensated is A×100/80, which compensates the white OLED device up to a luminous efficiency before aging.

Under normal circumstances, a sub-pixel that needs to emit light is compensated, while a sub-pixel that does not need to emit light is not compensated.

By compensating the white OLED devices and the driving transistors corresponding to the white sub-pixel and the primary-color sub-pixels, luminance of respective sub-pixels that have undergone aging is increased, and uniformity of a display color is improved.

In an embodiment of the present disclosure: the actual chromaticity coordinate of the light of the current mixed-color sub-pixel is acquired; the actual chromaticity coordinates of the light of the primary-color sub-pixels are measured, under the current lifetime indices of the white OLED devices corresponding to the current primary-color sub-pixels; the respective proportions of the light of the primary-color sub-pixels within the light of the mixed-color sub-pixel are calculated, according to the actual chromaticity coordinate of the light of the mixed-color sub-pixel and the chromaticity coordinates of the light of the primary-color sub-pixels; the target luminance data of the mixed-color sub-pixel and the target luminance data of the primary-color sub-pixels are determined, according to the initial luminance data of the primary-color sub-pixels and the respective proportions of the light of the primary-color sub-pixels within the light of the mixed-color sub-pixel; the compensation ratio of the white sub-pixel and the compensation ratios of the primary-color sub-pixels are determined, according to the lifetime indices of the white OLED devices corresponding to the white sub-pixel and the primary-color sub-pixels respectively; the white OLED devices and the driving transistors corresponding to the white sub-pixel and the primary-color sub-pixels are compensated, according to the target luminance data and the compensation ratios. The mixed-color sub-pixel is generally the white sub-pixel. When the white OLED device is aged, the chromaticity coordinate of the light of the white sub-pixel may shift. The target luminance data of the white sub-pixel and the target luminance data of the primary-color sub-pixels are determined according to: the proportions of the light of the primary-color sub-pixels included within the light of the white sub-pixel; and the initial luminance data of the primary-color sub-pixels. Thus, the final display color of the image has no color cast. The white OLED devices and the driving transistors corresponding to the white sub-pixel and the primary-color sub-pixels are compensated, so as to improve uniformity of the display color.

Embodiment Three

Figure 4:
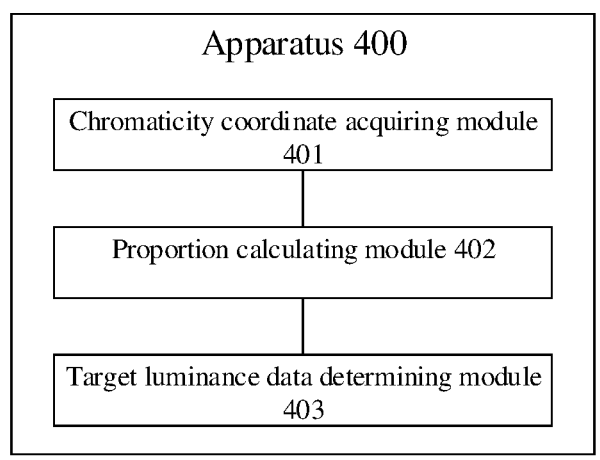
FIG. 4 is a structural block diagram of a display control apparatus according to a third embodiment of the present disclosure.

With reference to FIG. 4, a structural block diagram of a display control apparatus according to Embodiment Three of the present disclosure is shown.

A display control apparatus 400 according to an embodiment of the present disclosure comprises:

a chromaticity coordinate acquiring module 401, configured to acquire an actual chromaticity coordinate of light of a current mixed-color sub-pixel;

a proportion calculating module 402, configured to calculate respective proportions of light of primary-color sub-pixels within the light of the mixed-color sub-pixel, according to the actual chromaticity coordinate of the light of the mixed-color sub-pixel and chromaticity coordinates of the light of the primary-color sub-pixels.

a target luminance data determining module 403, configured to determine target luminance data of the mixed-color sub-pixel and target luminance data of the primary-color sub-pixels, according to initial luminance data of the primary-color sub-pixels and the respective proportions of the light of the primary-color sub-pixels within the light of the mixed-color sub-pixel.

In an embodiment of the present disclosure, the chromaticity coordinate acquiring module 401 acquires the actual chromaticity coordinate of the light of the current mixed-color sub-pixel; the proportion calculating module 402 calculates the respective proportions of the light of the primary-color sub-pixels within the light of the mixed-color sub-pixel, according to the actual chromaticity coordinate of the light of the mixed-color sub-pixel and the chromaticity coordinates of the light of the primary-color sub-pixels; the target luminance data determining module 403 determines the target luminance data of the mixed-color sub-pixel and the target luminance data of the primary-color sub-pixels, according to the initial luminance data of the primary-color sub-pixels and the respective proportions of the light of the primary-color sub-pixels within the light of the mixed-color sub-pixel. The mixed-color sub-pixel is generally the white sub-pixel. When the white OLED device is aged, the chromaticity coordinate of the light of the white sub-pixel will shift. The target luminance data of the white sub-pixel and the target luminance data of the primary-color sub-pixels are determined according to the proportions of the light of the primary-color sub-pixels included within the light of the white sub-pixel and the initial luminance data of the primary-color sub-pixels, so that a final display color of an image has no color cast.

For specific description of the chromaticity coordinate acquiring module 401, the proportion calculating module 402 and the target luminance data determining module 403, related description of FIG. 2 to FIG. 3 above may be referred to, which will not be repeated here.

Embodiment Four

Figure 5:
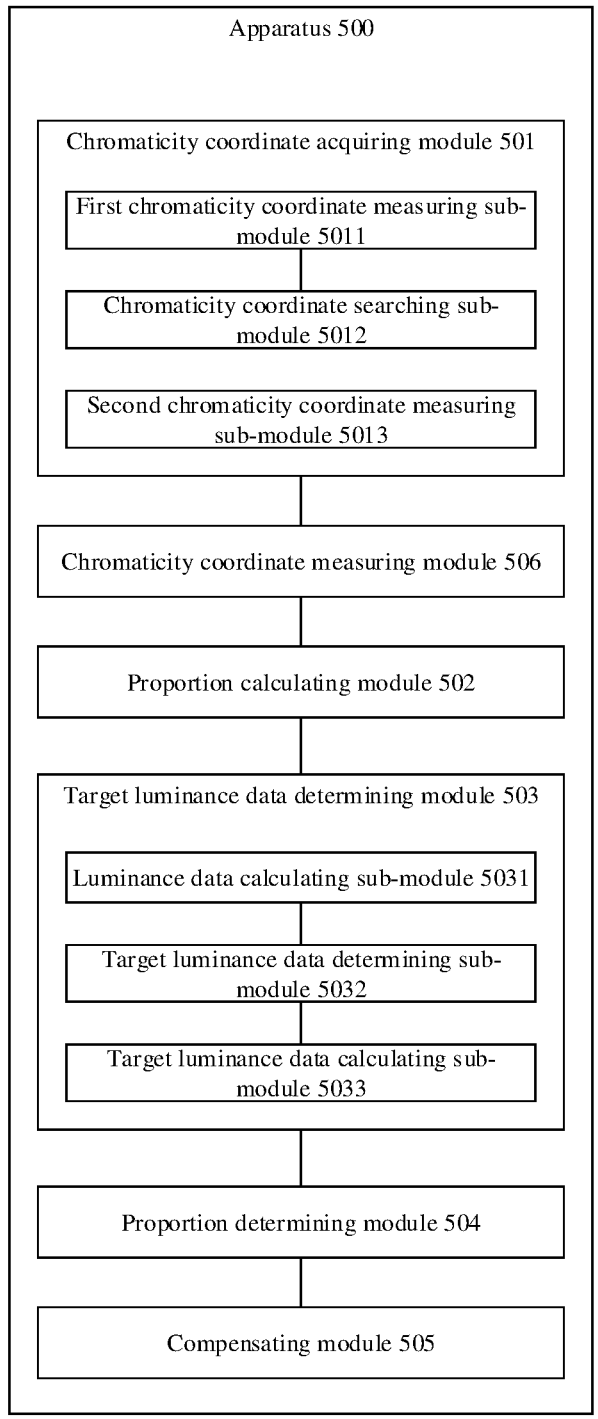
FIG. 5 shows a structural block diagram of a display control apparatus according to a fourth embodiment of the present disclosure.

With reference to FIG. 5, a structural block diagram of a display control apparatus according to Embodiment Four of the present disclosure is shown.

A display control apparatus 500 according to an embodiment of the present disclosure comprises:

a chromaticity coordinate acquiring module 501, configured to acquire an actual chromaticity coordinate of the light of a current mixed-color sub-pixel. For example, the chromaticity coordinate acquiring module 501 may further include: a first chromaticity coordinate measuring sub-module 5011, configured to pre-measure the actual chromaticity coordinates of light emitted by a white OLED device under different lifetime indices, and to store the measurement in a storage unit; a chromaticity coordinate searching sub-module 5012, configured to, based on a lifetime index of a white OLED device corresponding to a current white sub-pixel, search for an actual chromaticity coordinates of light emitted by the white OLED device corresponding to the lifetime index from the storage unit, which is treated as an actual chromaticity coordinate of the light of the current white sub-pixel. For example, the chromaticity coordinate acquiring module 501 may further include: a second chromaticity coordinate measuring sub-module 5013, configured to measure the actual chromaticity coordinate of the light of the white sub-pixel, under a current lifetime index of the white OLED device corresponding to the current white sub-pixel.

A proportion calculating module 502 is configured to calculate respective proportions of the light of primary-color sub-pixels within the light of the mixed-color sub-pixel, according to the actual chromaticity coordinate of the light of the mixed-color sub-pixel and chromaticity coordinates of the light of the primary-color sub-pixels.

For example, the primary-color sub-pixels include a red sub-pixel, a green sub-pixel and a blue sub-pixel, and the mixed-color sub-pixel is a white sub-pixel; or the primary-color sub-pixels include a yellow sub-pixel and a blue sub-pixel, and the mixed-color sub-pixel is a white sub-pixel.

A target luminance data determining module 503 is configured to determine target luminance data of the mixed-color sub-pixel and target luminance data of the primary-color sub-pixels, according to initial luminance data of the primary-color sub-pixels and the respective proportions of the light of the primary-color sub-pixels within the light of the mixed-color sub-pixel. For example, the target luminance data determining module 503 may further include a luminance data calculating sub-module 5031, configured to: calculate first luminance data by dividing initial luminance data of the red sub-pixel by a proportion of the light of the red sub-pixel within the light of the white sub-pixel; calculate second luminance data by dividing initial luminance data of the green sub-pixel by a proportion of the light of the green sub-pixel within the light of the white sub-pixel; and calculate third luminance data by dividing initial luminance data of the blue sub-pixel by a proportion of the light of the blue sub-pixel within the light of the white sub-pixel. The target luminance data determining module 503 may further include: a target luminance data determining sub-module 5032, configured to take the minimum luminance data among the first luminance data, the second luminance data and the third luminance data as the target luminance data of the white sub-pixel, and take a sub-pixel corresponding to the minimum luminance data as a target sub-pixel. The target luminance data determining module 503 may further include: a target luminance data calculating sub-module 5033, configured to: for each of the other sub-pixels (the remaining sub-pixels, except the target sub-pixel, within the primary-color sub-pixels are simply referred to as other sub-pixels), firstly calculate a product of the target luminance data of the white sub-pixel and the proportion of the light of the other sub-pixel within the light of the white sub-pixel, and then deduct the product from the initial luminance data of the other sub-pixel, the difference being the target luminance data of the other sub-pixel.

For example, the display control apparatus 500 further comprises:

a proportion determining module 504, configured to determine compensation ratios of the white sub-pixel and the primary-color sub-pixels, according to the lifetime indices of the white OLED devices corresponding to the white sub-pixel and the primary-color sub-pixels; and a compensating module 505, configured to respectively compensate the white OLED devices and the driving transistors corresponding to the white sub-pixel and the primary-color sub-pixels, according to the target luminance data and the compensation ratios.

For example, the display control apparatus 500 further comprises:

a chromaticity coordinate measuring module 506, configured to measure actual chromaticity coordinates of the light of the primary-color sub-pixels, under current lifetime indices of white OLED devices corresponding to the current primary-color sub-pixels.

In an embodiment of the present disclosure, the actual chromaticity coordinate of the light of the current mixed-color sub-pixel is acquired; the actual chromaticity coordinates of the light of the primary-color sub-pixels are measured, under the current lifetime indices of the white OLED devices corresponding to the current primary-color sub-pixels; the respective proportions of the light of the primary-color sub-pixels within the light of the mixed-color sub-pixel are calculated, according to the actual chromaticity coordinate of the light of the mixed-color sub-pixel and the chromaticity coordinates of the light of the primary-color sub-pixels; the target luminance data of the mixed-color sub-pixel and the target luminance data of the primary-color sub-pixels are determined, according to the initial luminance data of the primary-color sub-pixels and the respective proportions of the light of the primary-color sub-pixels within the light of the mixed-color sub-pixel; the compensation ratios of the white sub-pixel and the primary-color sub-pixels are determined, according to the lifetime indices of the white OLED devices corresponding to the white sub-pixel and the primary-color sub-pixels; the white OLED devices and the driving transistors corresponding to the white sub-pixel and the primary-color sub-pixels are compensated, according to the target luminance data and the compensation ratios. The mixed-color sub-pixel is generally the white sub-pixel. When the white OLED devices are aged, the chromaticity coordinates of the light of the white sub-pixels may shift. The target luminance data of the white sub-pixel and the target luminance data of the primary-color sub-pixels are determined according to the proportions of the light of the primary-color sub-pixels included within the light of the white sub-pixel and the initial luminance data of the primary-color sub-pixels, so that a final display color of an image has no color cast; and the white OLED devices and the driving transistors corresponding to the white sub-pixel and the primary-color sub-pixels are compensated respectively, so as to improve uniformity of the display color.

The embodiments of the present disclosure may further include one or more processors and one or more memories. The processor may process a data signal, and may include various computation structures, for example, a complex instruction set computer (CISC) structure, a reduced instruction set computer (RISC) structure, or a structure that implements a combination of various instruction sets. The memory may save instructions and/or data executed by the processor. These instructions and/or data may include codes, for implementing some or all of the functions of one or more devices as described in the embodiments of the present disclosure. For example, the memory includes dynamic random access memory (DRAM), static random access memory (SRAM), flash memory, optical memory, or other memory known to those skilled in the art.

In some embodiments, the chromaticity coordinate acquiring module and the respective sub-modules thereof, the proportion calculating module, the target luminance data determining module and the respective sub-modules thereof, the chromaticity coordinate measuring module, the proportion determining module and the compensation module in FIG. 4 and FIG. 5 may respectively include code and programs stored in the memory; and the processor may execute the code and the programs to implement some or all of the functions of the respective modules or sub-modules as described above.

In some embodiments, the chromaticity coordinate acquiring module and the respective sub-modules thereof, the proportion calculating module, the target luminance data determining module and the respective sub-modules thereof, the chromaticity coordinate measuring module, the proportion determining module and the compensation module in FIG. 4 and FIG. 5 may also be dedicated hardware devices for implementing some or all of the functions as described above. For example, they may be a single circuit board or a combination of a plurality of circuit boards for implementing the above-described functions. The single circuit board or the combination of a plurality of circuit boards may include: (1) one or more processors; (2) one or more non-transitory computer readable memories connected with the processor; and (3) processor-executable firmware stored in the memory.

Embodiment Five

An embodiment of the present disclosure further discloses a display apparatus, comprising the above-described display control apparatus. The display apparatus may be applied to a mobile phone, a tablet personal computer, a television, a monitor, a laptop, a navigator, and any other product or component having a display function.

For example, the display apparatus may further comprise a storage unit, for storing pre-measured actual chromaticity coordinates of light emitted by a white OLED device under different lifetime indices.

In an embodiment of the present disclosure, for specific description of the display control apparatus, description of Embodiment Three and Embodiment Four may be referred to, which will not be repeated in this embodiment.

In an embodiment of the present disclosure, the display apparatus comprises the display control apparatus. The display control apparatus may: acquire an actual chromaticity coordinate of the light of a current mixed-color sub-pixel; calculate respective proportions of the light of primary-color sub-pixels within the light of the mixed-color sub-pixel, according to the actual chromaticity coordinate of the light of the mixed-color sub-pixel and the chromaticity coordinates of the light of the primary-color sub-pixels; and determine target luminance data of the mixed-color sub-pixel and target luminance data of the primary-color sub-pixels, according to the initial luminance data of the primary-color sub-pixels and the respective proportions of the light of the primary-color sub-pixels within the light of the mixed-color sub-pixel. The mixed-color sub-pixel is generally the white sub-pixel. When a white OLED device is aged, the chromaticity coordinate of the light of the corresponding white sub-pixel may shift. The target luminance data of the white sub-pixel and the target luminance data of the primary-color sub-pixels are determined according to the proportions of the light of the primary-color sub-pixels included within the light of the white sub-pixel and the initial luminance data of the primary-color sub-pixels, so that a final display color of an image has no color cast.

With respect to the respective foregoing method embodiments, for the sake of simple description, they are all expressed as a series of action combinations; however, those skilled in the art should understand that the present disclosure is not limited to the described action order, because according to the present disclosure, some steps may be performed in other orders or simultaneously. Secondly, those skilled in the art should also understand that, the embodiments as described in this specification all belong to preferred embodiments, and the involved actions and modules are not necessarily required in the present disclosure.

The respective embodiments in this specification are described in a progressive manner, and each embodiment focuses on difference from other embodiments, and the same or similar parts among the respective embodiments may be referred to each other.

Finally, it should also be noted that, in this specification, terms like "first" and "second" are only used to differentiate one entity or operation from another, but are not necessarily used to indicate any practical relationship or order between these entities or operations. Moreover, terms such as "include", "comprise" or any variation of the terms mean "including but not limited to". Therefore, a process, method, object, or device that includes a series of elements not only includes these elements, but also includes other elements that are not specified expressly, or may further include inherent elements of the process, method, object or device. In the case that there are no more limitations, in the context of an element that is defined by "includes one . . . ", the process, method, object or device that includes the element may include other identical elements.

The display control method, apparatus and the display apparatus provided by the present disclosure are described above in detail, specific examples are used in this specification for explaining the principle and the implementation modes of the present disclosure; description of the foregoing embodiments is merely used for helping understand the method and its core idea of the present disclosure; meanwhile, those ordinarily skilled in the art, based on the idea of the present disclosure, will have changes in the specific implementation modes and application range; in summary, the contents of this specification should not be understood to be limitative of the present disclosure.

What are described above is related to the illustrative embodiments of the disclosure only and not limitative to the scope of the disclosure; any changes or replacements easily for those technical personnel who are familiar with this technology in the field to envisage in the scopes of the disclosure, should be in the scope of protection of the present disclosure. Therefore, the scopes of the disclosure are defined by the accompanying claims.

The present application claims the priority of the Chinese Patent Application No. 201710519926.5 filed on Jun. 30, 2017, which is incorporated herein by reference in its entirety as part of the disclosure of the present application.

The invention claimed is:

1. A display control method, applied to a display apparatus having primary-color sub-pixels and a mixed-color sub-pixel, comprising:
    acquiring an actual chromaticity coordinate of light of a mixed-color sub-pixel, wherein the primary-color sub-pixels include sub-pixels of at least two colors, and the mixed-color sub-pixel includes a sub-pixel of one color, and light of the primary-color sub-pixels is mixed to obtain the light of the mixed-color sub-pixel;
    calculating respective proportions of the light of the primary-color sub-pixels within the light of the mixed-color sub-pixel, according to the actual chromaticity coordinate of the light of the mixed-color sub-pixel and chromaticity coordinates of the light of the primary-color sub-pixels; and
    determining target luminance data of the mixed-color sub-pixel and target luminance data of the primary-color sub-pixels, according to initial luminance data of the primary-color sub-pixels and the respective proportions of the light of the primary-color sub-pixels within the light of the mixed-color sub-pixel,
    wherein the primary-color sub-pixels include a red sub-pixel, a green sub-pixel and a blue sub-pixel, and the mixed-color sub-pixel is a white sub-pixel; or, the primary-color sub-pixels include a yellow sub-pixel and a blue sub-pixel, and the mixed-color sub-pixel is a white sub-pixel, the step of determining the target luminance data of the mixed-color sub-pixel and the target luminance data of the primary-color sub-pixels, includes:
    calculating first luminance data by dividing initial luminance data of the red sub-pixel by a proportion of light of the red sub-pixel within the light of the white sub-pixel;
    calculating second luminance data by dividing initial luminance data of the green sub-pixel by a proportion of light of the green sub-pixel within the light of the white sub-pixel; and calculating third luminance data by dividing initial luminance data of the blue sub-pixel by a proportion of light of the blue sub-pixel within the light of the white sub-pixel;
    taking minimum luminance data among the first luminance data, the second luminance data and the third luminance data as target luminance data of the white sub-pixel, and taking a sub-pixel corresponding to the minimum luminance data as a target sub-pixel, sub-pixels within the primary-color sub-pixels except the target sub-pixel being other sub-pixels; and
    for each of the other sub-pixels, calculating a product of the target luminance data of the white sub-pixel and a proportion of light of the other sub-pixel within the light of the white sub-pixel, and deducting the product from initial luminance data of the other sub-pixel, a resulting difference being target luminance data of the other sub-pixel.

2. The method according to claim 1, wherein the display apparatus is an OLED display apparatus, and each of the red sub-pixel, the green sub-pixel, the blue sub-pixel and the white sub-pixel includes a white OLED device; and
    the red sub-pixel, the green sub-pixel and the blue sub-pixel obtain colors of their own through color filters respectively;
    the step of acquiring the actual chromaticity coordinate of the light of the mixed-color sub-pixel, includes:
    pre-measuring actual chromaticity coordinates of light emitted by a pre-measured white OLED device under different lifetime indices, and storing the actual chromaticity coordinates in a storage unit; and
    based on a lifetime index of a white OLED device corresponding to a white sub-pixel, searching in the storage unit for an actual chromaticity coordinate of light emitted by the pre-measured white OLED device that corresponds to the lifetime index, which is treated as the actual chromaticity coordinate of the light of the white sub-pixel.

3. The method according to claim 1, wherein the step of acquiring the actual chromaticity coordinate of the light of the mixed-color sub-pixel, includes:
    measuring the actual chromaticity coordinate of the light of the white sub-pixel, under a current lifetime index of a white OLED device corresponding to the white sub-pixel.

4. The method according to claim 1, wherein after the step of determining the target luminance data of the mixed-color sub-pixel and the target luminance data of the primary-color sub-pixels, the method further comprises:
    determining compensation ratios of the white sub-pixel and the primary-color sub-pixels, according to lifetime indices of white OLED devices corresponding to the white sub-pixel and the primary-color sub-pixels; and
    compensating the white OLED devices and driving transistors corresponding to the white sub-pixel and the primary-color sub-pixels, according to the target luminance data of the mixed-color sub-pixel, the target luminance data of the primary-color sub-pixels and the compensation ratios.

5. The method according to claim 1, wherein the respective proportions of the light of the primary-color sub-pixels within the light of the mixed-color sub-pixel include the proportion of the light of the red sub-pixel within the light of the white sub-pixel, the proportion of the light of the green sub-pixel within the light of the white sub-pixel, and the proportion of the light of the blue sub-pixel within the light of the white sub-pixel.

6. The method according to claim 1, wherein before the step of calculating the respective proportions of the light of the primary-color sub-pixels within the light of the mixed-color sub-pixel, the method further comprises:
measuring the actual chromaticity coordinates of the light of the primary-color sub-pixels, under current lifetime indices of white OLED devices corresponding to the primary-color sub-pixels.

7. A display control apparatus, comprising a processor and a memory having codes, wherein the processor executes the codes to perform:
acquiring an actual chromaticity coordinate of light of a mixed-color sub-pixel;
calculating respective proportions of light of primary-color sub-pixels within the light of the mixed-color sub-pixel, according to the actual chromaticity coordinate of the light of the mixed-color sub-pixel and chromaticity coordinates of the light of the primary-color sub-pixels; and
determining target luminance data of the mixed-color sub-pixel and target luminance data of the primary-color sub-pixels, according to initial luminance data of the primary-color sub-pixels and the respective proportions of the light of the primary-color sub-pixels within the light of the mixed-color sub-pixel,
wherein the primary-color sub-pixels include a red sub-pixel, a green sub-pixel and a blue sub-pixel, and the mixed-color sub-pixel is a white sub-pixel; or the primary-color sub-pixels include a yellow sub-pixel and a blue sub-pixel, and the mixed-color sub-pixel is a white sub-pixel,
determining target luminance data of the mixed-color sub-pixel and target luminance data of the primary-color sub-pixels, according to initial luminance data of the primary-color sub-pixels and the respective proportions of the light of the primary-color sub-pixels within the light of the mixed-color sub-pixel includes: calculating first luminance data by dividing initial luminance data of the red sub-pixel by a proportion of light of the red sub-pixel within the light of the white sub-pixel; calculating second luminance data by dividing initial luminance data of the green sub-pixel by a proportion of light of the green sub-pixel within the light of the white sub-pixel; and calculating third luminance data by dividing initial luminance data of the blue sub-pixel by a proportion of light of the blue sub-pixel within the light of the white sub-pixel;
taking minimum luminance data among the first luminance data, the second luminance data and the third luminance data as target luminance data of the white sub-pixel; and taking a sub-pixel corresponding to the minimum luminance data as a target sub-pixel, sub-pixels within the primary-color sub-pixels except the target sub-pixel being other sub-pixels; and
for each of the other sub-pixels, calculating a product of the target luminance data of the white sub-pixel and a proportion of light of the other sub-pixel within the light of the white sub-pixel, and deducting the product from initial luminance data of the other sub-pixel, a resulting difference being target luminance data of the other sub-pixel.

8. The apparatus according to claim 7, wherein acquiring an actual chromaticity coordinate of light of a mixed-color sub-pixel includes:
pre-measuring actual chromaticity coordinates of light emitted by a pre-measured white OLED device under different lifetime indices, and store the actual chromaticity coordinates in a storage unit; and
based on a lifetime index of a white OLED device corresponding to a white sub-pixel, searching in the storage unit for an actual chromaticity coordinate of light emitted by the pre-measured white OLED device that corresponds to the lifetime index, which is treated as the actual chromaticity coordinate of the light of the white sub-pixel.

9. The apparatus according to claim 7, wherein acquiring an actual chromaticity coordinate of light of a mixed-color sub-pixel includes:
measuring the actual chromaticity coordinate of the light of the white sub-pixel, under a current lifetime index of a white OLED device corresponding to the white sub-pixel.

10. The apparatus according to claim 7, wherein the processor executes the codes to further perform:
compensation ratios of the white sub-pixel and the primary-color sub-pixels, according to lifetime indices of white OLED devices corresponding to the white sub-pixel and the primary-color sub-pixels;
devices and driving transistors corresponding to the white sub-pixel and the primary-color sub-pixels, according to the target luminance data of the mixed-color sub-pixel, the target luminance data of the primary-color sub-pixels and the compensation ratios.

11. The apparatus according to claim 7, wherein the respective proportions of the light of the primary-color sub-pixels within the light of the mixed-color sub-pixel include the proportion of the light of the red sub-pixel within the light of the white sub-pixel, the proportion of the light of the green sub-pixel within the light of the white sub-pixel, and the proportion of the light of the blue sub-pixel within the light of the white sub-pixel.

12. The apparatus according to claim 7, wherein the processor executes the codes to further perform:
measuring actual chromaticity coordinates of the light of the primary-color sub-pixels, under current lifetime indices of white OLED devices corresponding to the primary-color sub-pixels.

13. A display apparatus, comprising the apparatus according to claim 7.

* * * * *